(12) United States Patent
Schmitz et al.

(10) Patent No.: US 9,176,398 B2
(45) Date of Patent: Nov. 3, 2015

(54) METHOD AND SYSTEM FOR THERMALLY CONDITIONING AN OPTICAL ELEMENT

(75) Inventors: Roger Wilhelmus Antonius Henricus Schmitz, Helmond (NL); Tjarko Adriaan Rudolf Van Empel, Eindhoven (NL); Marcel Johannus Elisabeth Hubertus Muitjens, Nuth (NL); Lun Cheng, Krimpen aan den Ijssel (NL); Franciscus Johannes Joseph Janssen, Geldrop (NL); Willem Arie Van Helden, Bergschenhoek (NL); Richard Versluis, Delft (NL); Paulus Bartholomeus Johannes Schaareman, Eindhoven (NL); Axel Sebastiaan Lexmond, Voorschoten (NL); Evert Nieuwkoop, Pijnacker (NL); Charles William Barras Potts, Wallington (GB); Martinus Henricus Johannes Lemmen, Haarlem (NL); Frederik Van Der Graaf, Zuidland (NL); Mathilde Gertrudis Maria De Kroon, Delfgauw (NL); Johannes Fransiscus Maria Velthuis, Leiden (NL)

(73) Assignee: ASML NETHERLANDS B.V., Veldhoven (NL)

(*) Notice: Subject to any disclaimer, the term of this patent is extended or adjusted under 35 U.S.C. 154(b) by 1142 days.

(21) Appl. No.: 12/996,945

(22) PCT Filed: May 20, 2009

(86) PCT No.: PCT/EP2009/056131
§ 371 (c)(1),
(2), (4) Date: May 2, 2011

(87) PCT Pub. No.: WO2009/150018
PCT Pub. Date: Dec. 17, 2009

(65) Prior Publication Data
US 2011/0310368 A1    Dec. 22, 2011

Related U.S. Application Data (60) Provisional application No. 61/129,180, filed on Jun. 10, 2008.

(51) Int. Cl.
G02B 7/02    (2006.01)
G02B 7/18    (2006.01)
(Continued)

(52) U.S. Cl.
CPC ............ G03F 7/70891 (2013.01); G02B 7/008 (2013.01); G03F 7/709 (2013.01); G03F 7/70875 (2013.01); G03F 7/70983 (2013.01); *G21K 2201/067* (2013.01)

(58) Field of Classification Search
CPC ........ G02B 7/008; G02B 7/028; G02B 7/181; G02B 7/1815; G02B 7/195; G03F 7/70858; G03F 7/70875; G03F 7/70891; G03F 7/709; G03F 7/70983
USPC ............ 355/30, 53, 72, 75, 77; 359/512, 820, 359/845
See application file for complete search history.

(56) References Cited

U.S. PATENT DOCUMENTS 5,231,291 A  *  7/1993  Amemiya et al. ......... 250/443.1
5,386,427 A       1/1995  Zayhowski
(Continued)

FOREIGN PATENT DOCUMENTS

EP    0 411 916 A2    2/1991
EP    1 283 446       2/2003
(Continued)

OTHER PUBLICATIONS

Chinese Office Action dated Aug. 17, 2012 in corresponding Chinese Patent Application No. 200980121967.2.
(Continued)

*Primary Examiner* — Colin Kreutzer
(74) *Attorney, Agent, or Firm* — Pillsbury Winthrop Shaw Pittman LLP (57) ABSTRACT

A method for thermally conditioning an optical element includes irradiating the optical element with radiation, not-irradiating the optical element with the radiation, allowing heat flow between the optical element and a conditioning fluid that is held in a conditioning fluid reservoir, and providing a fluid flow of the conditioning fluid, to supply thermally conditioned fluid to the reservoir. A flow rate of the fluid during the irradiating of the optical element is lower than a flow rate of the fluid when the optical element is not-irradiated.

13 Claims, 5 Drawing Sheets

(51) Int. Cl.
*G03B 27/32* (2006.01)
*G03B 27/52* (2006.01)
*G03B 27/58* (2006.01)
*G03B 27/62* (2006.01)
*G03F 7/20* (2006.01)
*G02B 7/00* (2006.01)

(56) References Cited

U.S. PATENT DOCUMENTS

| | | | |
|---|---|---|---|
| 5,610,965 A * | 3/1997 | Mori et al. | 378/34 |
| 5,777,807 A * | 7/1998 | Bar et al. | 359/845 |
| 6,509,951 B2 | 1/2003 | Loopstra et al. | |
| 6,768,600 B2 | 7/2004 | Dieker | |
| 7,130,019 B2 | 10/2006 | Bartray et al. | |
| 7,545,478 B2 | 6/2009 | Box et al. | |
| 7,956,982 B2 | 6/2011 | Hol et al. | |
| 2001/0013925 A1 | 8/2001 | Loopstra et al. | |
| 2002/0108707 A1 | 8/2002 | Kobayashi et al. | |
| 2002/0114374 A1* | 8/2002 | Exel et al. | 372/99 |
| 2005/0073663 A1 | 4/2005 | Miyajima | |
| 2005/0151954 A1 | 7/2005 | Bartray et al. | |
| 2006/0076108 A1 | 4/2006 | Holland et al. | |
| 2006/0227826 A1 | 10/2006 | Balogh et al. | |
| 2007/0089853 A1* | 4/2007 | Nomoto | 165/65 |
| 2007/0114655 A1 | 5/2007 | Hol et al. | |
| 2009/0103063 A1* | 4/2009 | Nishikawa | 355/30 |
| 2009/0147386 A1* | 6/2009 | Sogard et al. | 359/845 |

FOREIGN PATENT DOCUMENTS

| | | |
|---|---|---|
| EP | 1 477 853 | 11/2004 |
| JP | H02-067714 | 3/1990 |
| JP | 3-62920 | 3/1991 |
| JP | 3-91916 | 4/1991 |
| JP | 11-243052 | 9/1999 |
| JP | 2002-198305 | 7/2002 |
| JP | 2004-39862 | 2/2004 |
| JP | 2004-246030 | 9/2004 |
| JP | 2005-24818 | 1/2005 |
| JP | 2005-322907 | 11/2005 |
| TW | I238292 | 8/2005 |
| TW | 200528930 | 9/2005 |
| TW | 200727094 | 7/2007 |
| TW | 200741366 | 11/2007 |
| WO | WO 01/97270 | 12/2001 |
| WO | WO 02/05325 | 1/2002 |

OTHER PUBLICATIONS

International Search Report as issued for PCT/EP2009/056131, dated Aug. 13, 2009.

Taiwan Office Action dated Apr. 15, 2013 in corresponding Taiwan Patent Application No. 098118586.

Japanese Office Action dated Jan. 5, 2015 in corresponding Japanese Patent Application No. 2014-076940.

* cited by examiner

METHOD AND SYSTEM FOR THERMALLY CONDITIONING AN OPTICAL ELEMENT

CROSS-REFERENCE TO RELATED APPLICATIONS

This application is the National Phase entry of PCT/EP2009/056131, which claims the benefit of U.S. provisional application 61/129,180, which was filed on Jun. 10, 2008, and which is incorporated herein in its entirety by reference.

FIELD

The present application relates to a method and system for thermally conditioning an optical element.

BACKGROUND

In various fields of technology, it is desirable to thermally condition optical elements, particularly optical elements that are subjected to high heat loads. In the following, as an example, the field of lithography will be described.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, NAPS is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NAPS or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of between 5 nm and 20 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

To provide a desired high degree of imaging accuracy, the optical elements of the apparatus should be positioned precisely (for example: in respective stationary positions) during respective substrate steps. Thus, it is desired to prevent uncontrolled vibrations of the projection optics as much as feasible.

Also, it is desirable to increase source power to provide increased radiation doses, for example to improve throughput. However, increased radiation doses may lead to higher heat loads in the apparatus. As a result, performance of optical components (for example mirrors) of the projection system can be impaired, both due to increased thermal expansions as well as contamination related issues, due to the heat loads.

SUMMARY

It is desirable to at least partly reduce the above-mentioned problems. Particularly, it is desired to provide an efficient way to thermally condition an optical element that can be subjected to high heat loads during its operation, without impairing accuracy of the element's operation.

According to an embodiment, there is provided a method for thermally conditioning an optical element. The method includes irradiating the optical element with radiation, not-irradiating the optical element with the radiation, allowing heat flow between the optical element and a conditioning fluid that is held in a conditioning fluid reservoir, and providing a fluid flow of the conditioning fluid, to supply thermally conditioned fluid to the reservoir. A flow rate of the fluid during the irradiating of the optical element is lower than a flow rate of the fluid when the optical element is not-irradiated. The fluid flow rate may be substantially zero during the irradiating.

According to an embodiment, there is provided a lithographic projection method that includes transferring a pattern from a patterning structure onto a substrate, utilizing an optical element, and thermally conditioning the optical element. The conditioning includes irradiating the optical element with radiation, not-irradiating the optical element with the radiation, allowing heat flow between the optical element and a conditioning fluid that is held in a conditioning fluid reservoir, and providing a fluid flow of the conditioning fluid, to supply thermally conditioned fluid to the reservoir. A flow rate of the fluid during the irradiating of the optical element is lower than a flow rate of the fluid when the optical element is not-irradiated. The flow rate of the fluid during the irradiating may be substantially zero.

According to an embodiment, there is provided a thermal conditioning system constructed and arranged to thermally condition an optical element. The system includes a heat exchanger configured to allow heat exchange between a conditioning fluid and the optical element, and a fluid flow controller configured to control a flow rate of the conditioning fluid. The flow controller is configured to increase the flow rate of the fluid to a first flow rate during a non-irradiation of the optical element, and/or decrease the flow rate of the fluid to a second flow rate before irradiation of the optical element. The flow controller may be configured to set the second fluid flow rate to zero during the irradiation.

According to an embodiment, there is provided a lithographic apparatus configured to transfer a pattern from a patterning structure onto a substrate. The apparatus includes a projection system configured to project a pattern imparted to a radiation beam onto a target portion of a substrate. The projection system comprising a plurality of optical elements.

The apparatus includes a thermal conditioning system configured to thermally condition at least one of the optical elements of the projection system. The thermal conditioning system includes a heat exchanger configured to allow heat exchange between a conditioning fluid and the optical element, a flow controller configured to control the flow rate of the conditioning fluid, and to provide a first flow rate during an idle mode of the optical element, and to provide a second flow rate during a radiation projection mode of the optical element. The second flow rate is lower than the first flow rate and may even be zero.

According to an embodiment, there is provided an optical element that includes a heat exchanger configured to exchange heat with a thermal conditioning fluid.

According to an embodiment, there is provided a heat exchanger configured to allow heat exchange between a conditioning fluid and an optical element.

According to an embodiment, there is provided a method for thermally conditioning an optical element. The method includes irradiating the optical element with radiation, flowing heat between the optical element and a conditioning fluid that is held in a conditioning fluid reservoir, and supplying thermally conditioned fluid to the reservoir at a flow rate. The flow rate of the fluid during the irradiating is lower than the flow rate of the fluid when the optical element is not being irradiated with radiation.

BRIEF DESCRIPTION OF THE DRAWINGS

Embodiments will now be described, by way of example only, with reference to the accompanying schematic drawings in which corresponding reference symbols indicate corresponding parts, and in which.

DETAILED DESCRIPTION

Figure 1:
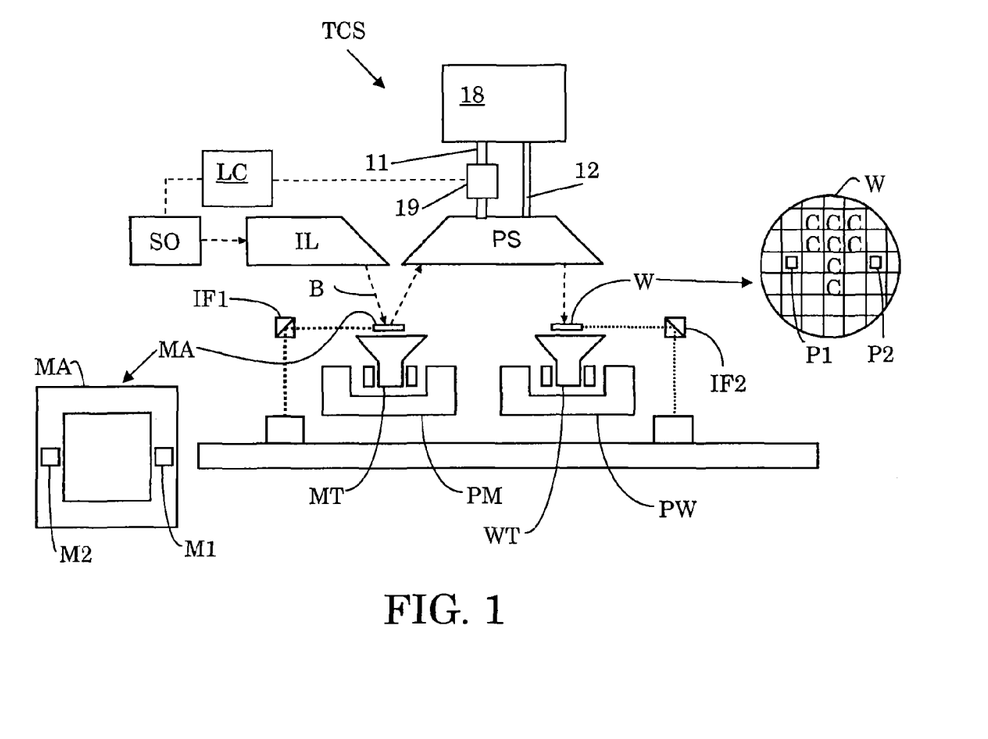
FIG. 1 depicts an embodiment of a lithographic apparatus of the present invention.

FIG. 1 schematically depicts an example of a lithographic apparatus. The apparatus can comprise: an illumination system (illuminator) IL configured to condition a radiation beam B (e.g. EUV radiation); a first patterning holder MT (e.g. a mask table) constructed to hold (particularly to support) a patterning structure or device (e.g. a mask or a reticle) MA and desirably being connected to a first positioner PM configured to accurately position the patterning structure; a first substrate holder WT (e.g. a substrate table or wafer table) constructed to hold a substrate (e.g. a resist coated wafer) W and desirably being connected to a second positioner PW configured to accurately position the substrate; and a projection system (e.g. a reflective projection lens system) PS configured to project a pattern imparted to the radiation beam B by patterning structure MA, held by the first patterning structure holder MT, onto a target portion C (e.g. comprising one or more dies) of a substrate W that is held by the first substrate holder WT. For example, the apparatus can include a projection optics box that contains the projection system PS.

Desirably, the system includes a thermal conditioning system TCS (or thermal conditioner) that is constructed and arranged to thermally condition at least one optical element 2, for example an element 2 of the projection system PS. Nonlimiting examples of the thermal conditioning system TCS, and parts thereof, are described below, and are depicted in FIGS. 2-7.

The illumination system can include various types of optical components, such as refractive, reflective, magnetic, electromagnetic, electrostatic or other types of optical components, or any combination thereof, for directing, shaping, or controlling radiation.

The first patterning structure holder MT can hold the patterning structure in a manner that depends on the orientation of the patterning structure, the design of the lithographic apparatus, and other conditions, such as for example whether or not the patterning structure is held in a vacuum environment. The support structure can use mechanical, vacuum, electrostatic or other clamping techniques to hold the patterning structure. The support structure can be a frame or a table, for example, which can be fixed or movable as desired. The support structure can ensure that the patterning structure is at a desired position, for example with respect to the projection system.

The term "patterning structure" should be broadly interpreted as referring to any device that can be used to impart a radiation beam with a pattern in its cross-section such as to create a pattern in a target portion of the substrate. The pattern imparted to the radiation beam can correspond to a particular functional layer in a device being created in the target portion, such as an integrated circuit.

The patterning structure can be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" can encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It can be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, during operation, the illuminator IL can receive a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross section.

The radiation beam B is incident on the patterning structure (e.g., mask) MA, which is held on the respective first holder or support structure (e.g., mask table) MT, and is patterned by the patterning structure. After being reflected from the patterning structure (e.g. mask) MA, the radiation beam B passes through the projection system PS, which focuses the beam onto a target portion C of the substrate W (held by the respective holder WT). With the aid of the second positioner PW and position sensor IF2 (e.g. an interferometric device, linear encoder or capacitive sensor), the first substrate holder WT (e.g. substrate table) can be moved accurately, e.g. so as to position different target portions C in the path of the radiation beam B. Similarly, the first positioner PM and another position sensor IF1 can be used to accurately position the patterning structure (e.g. mask) MA with respect to the path of the radiation beam B. Patterning structure (e.g. mask) MA and substrate W may be aligned using mask alignment marks M1, M2 and substrate alignment marks P1, P2.

The depicted apparatus could be used in at least one of the following modes:

1. In step mode, the reticle holding structure (e.g. mask table) MT and the first substrate holder WT are kept essentially stationary, while an entire pattern imparted to the radiation beam is projected onto a target portion C at one time (i.e. a single static exposure). The substrate holder WT is then shifted in the X and/or Y direction so that a different target portion C can be exposed.

2. In scan mode, the mask holder structure (e.g. mask table) MT and the first substrate holder WT are scanned synchronously while a pattern imparted to the radiation beam is projected onto a target portion C (i.e. a single dynamic exposure). The velocity and direction of the substrate holder WT relative to the mask holder (e.g. mask table) MT may be determined by the (de-)magnification and image reversal characteristics of the projection system PS.

3. In another mode, the mask holder (e.g. mask table) MT is kept essentially stationary holding a programmable patterning structure, and the substrate holder WT is moved or scanned while a pattern imparted to the radiation beam is projected onto a target portion C. In this mode, generally a pulsed radiation source is employed and the programmable patterning structure is updated as desired after each movement of the substrate holder WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

As follows from the above, according to a further embodiment, the lithographic apparatus can include a system TCS for thermally conditioning at least one of the optical elements 2 of the projection system PS. Alternatively, one or more other optical elements of a lithographic apparatus can be thermally conditioned by the system TCS, for example one or more optical components of an illuminator IL.

According to a further example, the thermal conditioning system TCS can remove heat from one or more optical elements 2 (for example projection system elements), the heat relating to the optical elements 2 receiving at least part of the lithographic radiation beam B (and absorbing some of that radiation) during lithography.

Non-limiting examples of the system TCS are depicted in FIGS. 2-7. The thermal conditioning system TCS can also be applied in other applications than lithographic apparatus applications, for example in optics, microscopy. For example, the thermal conditioning system can be applied in case one or more optical elements receive high heat loads during their operation.

An optical element 2, to be thermally conditioned by the system TCS, can be a mirror, a lens, a diffraction grating, a filter element, or a different type of optical element. In the following non-limiting examples, a thermal conditioning system to condition one or more mirrors 2 will be described.

As is shown in FIGS. 2A-2D, an embodiment of the thermal conditioning system TCS can comprise at least one heat exchanger 3 being configured to allow heat exchange between a conditioning fluid and the respective optical element 2.

For example, the optical element 2 can include (for example, being provided with, cooperating with, comprising, or integrally having) a heat exchanger 3 that can allow heat exchange with a substantially stationary thermal conditioning fluid.

The heat exchanger 3 can be configured in many different ways. The heat exchanger 3 can include a (i.e. at least one) thermal conditioning fluid reservoir 7, configured to hold (for example, contain, receive) a thermal conditioning fluid. Desirably, a heat capacity of the thermal conditioning fluid is higher than 1 kJ/kgK (at 20° C.).

The fluid can be a liquid. Desirably, the fluid is water; water has a high heat capacity (4.2 kJ/kgK at 20° C.) and is a convenient heat transporting medium.

The fluid reservoir 7 as such can be configured in various ways. Some reservoir examples as shown in the drawings. For example, the reservoir 7 can be an internal space of a respective component or structure, which internal space can receive and hold a fluid. The reservoir 7 can be provided by a single fluid receiving space, or by a plurality of separate fluid receiving spaces (for example being separated from each other by one or more fluid barriers).

The reservoir 7 can be provided by one or more fluid inlets to allow fluid to flow to the reservoir. The reservoir 7 can be provided by one or more fluid outlets to allow fluid to flow from (for example out of, away from) the reservoir. The reservoir 7 can have various shapes, for example a relatively flay reservoir shape wherein one orthogonal dimension of the reservoir is at least ten times smaller than two other orthogonal reservoir dimensions. The reservoir can be an elongated reservoir (for example, in case the reservoir is provided by one or more fluid duct pipes). Also, in certain embodiments, the reservoir 7 can have a rectangular cross-section, a circular cross-section, an elliptical cross-section, another cross-section shape and/or a combination of such cross-section shapes.

The reservoir 7 can also be configured in a different manner.

In an embodiment, the heat exchanger 3 may be integrated with a support 4 that supports the optical element 2 during operation. Each support 4 can be connected, for example, to a holding frame of the lithographic apparatus, for example a rigid mounting structure, for example a part of a projection optics box of the projection system.

The support 4 can act as a heat exchanger, to exchange heat between the optical element 2 (being supported thereby) and a fluid (particularly, a fluid being present in the support).

The support 4 can be configured in various ways to support the respective optical element 2. For example, an optical element 2 can be fixed to a respective support 4 using an adhesive, and/or by application of one or more connectors, and/or via a clamping device, and/or in a different manner.

According to yet a further embodiment, the support 4 and optical element 2 are integrated with each other. For example, the optical element 2 can be self-supporting (see FIGS. 6A and 6B).

Also, for example, the heat exchanger 3 can be part of (i.e. can be provided by) the optical element 2 as such. Similarly, the respective fluid reservoir 7 can be (an internal) part of the optical element 2 as such (see FIGS. 6A and 6B).

The thermal conditioning system TCS can be configured to provide a homogeneous thermal conditioning of the optical element 2. For example, according to an embodiment, a back surface of the optical element 2 and a support surface of a support 4 that faces the optical element's back surface contact each other uninterruptedly, such that a homogeneous thermal conditioning of the element 2 can be achieved by the support 4.

Desirably, a volume of the fluid reservoir 7 is relatively large compared to a volume of the optical element 2 as such. For example, the volume of the fluid reservoir can include a thermal volume, a thermal mass, or both.

For example, in case the reservoir 7 is part of a support 4 of the optical element 2, a volume of the reservoir can be at least 50%, and more particularly more than 75%, of a total volume of the respective optical element 2. Good results may be achieved in case a volume of the reservoir 7, integrated in the support 4, is larger than a volume of the respective optical element 2, for example at least twice as large. Thus, during operation, the support 4 can hold a relatively large volume of thermal conditioning fluid in the respective reservoir 7.

According to a further embodiment, the volume of the fluid reservoir 7 is larger than 50 ml. For example, the volume of the fluid reservoir can be 100 ml or larger.

According to a further embodiment, the fluid reservoir 7 is configured to hold a mass of conditioning fluid of at least 0.1 kg. For example, in case the conditioning fluid is water, the reservoir 7 can hold at least 0.1 kg of water; such a mass of water can absorb 4200 J at a 10 K temperature rise, corresponding to 100 Watts during 42 seconds.

Alternatively, in the case that the fluid reservoir 7 is integrated in the optical element 2 (see FIGS. 6A and 6B), the reservoir 7 can be shaped and dimensions to provide a substantially homogeneous thermal conditioning of the respective element 2; for example, a substantial part of a total volume of the optical element 2 can be encompassed by the reservoir 7. According to a further embodiment, at least 50%, and more particularly at least 80%, a total volume of the optical element 2 is encompassed by the reservoir 7. Thus, during operation, the optical element 2 can hold a relatively large volume of thermal conditioning fluid in the respective reservoir 7.

According to an embodiment, in case the reservoir 7 (see FIG. 6B) is part of the optical element 2 (for example, in case the reservoir 7 is integrated in the optical element 2), the optical element 2 as such can be configured to provide a relatively high thermal conductivity between the optical element 2 (supported by the support 4) and the fluid that is present in the fluid reservoir 7. Good results may be obtained in case that high thermal is at least 0.6 W/Km, particularly at least 1 W/Km, and more particularly at least 50 W/Km.

For example, the optical element 2 can include one or more materials having a high thermal conductivity (for example of an above-mentioned exemplary value), which material(s) to provide a relatively high heat transfer rate to the fluid held in the element 2, during operation. For example, such material can be or include a suitable metal or alloy or ceramic, for example Silicon (Si), Silicon Carbide (SiC), SiSiC or AIN.

According to an embodiment, the support 4 can be configured to provide a relatively high thermal conductivity between the optical element 2 (supported by the support 4) and the fluid that is present in the fluid reservoir 7 of the support.

For example, the support can include one or more materials having a high thermal conductivity, which material(s) extend between the optical element 2 and the fluid reservoir. For example, such material can be or include a suitable metal or alloy or ceramic, for example Silicon (Si), Silicon Carbide (SiC), SiSiC or AIN.

Good results may be obtained in case that high thermal is at least 0.6 W/Km, particularly at least 1 W/Km, and more particularly at least 50 W/Km.

The fluid in the fluid reservoir 7 can act as a thermal buffer. During operation, heat can be transferred between the fluid and the optical element 2, to maintain the optical element 2 at or near a desired operating temperature, or for example within a desired operating temperature range. Herein, at least part of the support 4 can provide a heat transfer structure that transfers the heat between the element 2 and the fluid that is present in the reservoir 7. Desirably, the reservoir 7 is embedded in a material (i.e. is defined by a structure) having an afore-mentioned relatively high thermal conductivity.

Desirably, the system TCS is configured such that a fluid pressure in the reservoir 7 is constant during operation, and particularly during irradiation steps involving irradiation of the optical element 2 with the radiation B. In this way, deformation of the optical element 2 due to pressure variations can be prevented.

Figure 2A:
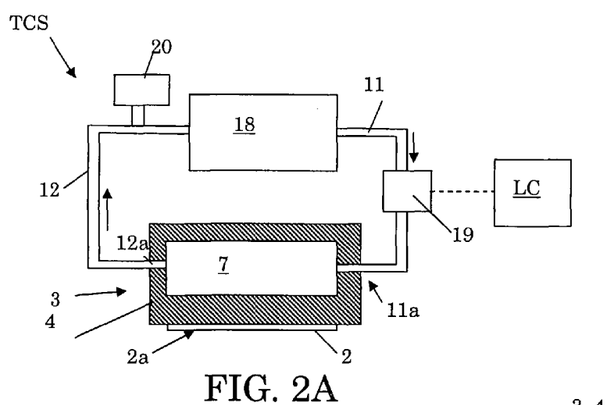
FIG. 2A schematically depicts an embodiment of a thermal conditioning system of the apparatus of FIG. 1, that includes an embodiment of a heat exchanger during a fluid replenishing step.

In ane embodiment, the heat conditioning system TCS includes a fluid supply duct system 11 to feed fluid to the reservoir 7, and a return duct system 12 for discharging fluid from the reservoir 7 (see for example FIGS. 1 an 2A). For example, the reservoir 7 can be provided with one or more fluid inlet ports 11a receiving fluid from the supply duct system 11, and one or more fluid outlet ports 12a to exhaust fluid from the reservoir 7 into the return duct system 12. Each duct system 11, 12 can be configured in various ways, including for example one or more fluid channels, manifolds, valves and/or other fluid transporters.

In the present embodiment, the duct system 11, 12 can be provided with a pressure maintenance device 20, for example an expansion vessel, configured to maintain a fluid pressure in the duct system 11, 12 (and reservoir 7) at a certain operating pressure. Desirably (see the above), the pressure maintenance device 20 can operate to achieve a constant fluid pressure in the fluid reservoir 7.

The thermal conditioning system TCS can include one or more fluid temperature controller units 18 (fluid temperature controllers), configured to control the temperature of the conditioning fluid. For example, a temperature controller unit 18 can receive the fluid from the return duct system 12, thermally condition the received fluid, an feed the thermally conditioned fluid to the supply duct system 11. To this aim, for example, the temperature controller unit 18 can be provided with a temperature sensor, a cooling device to cool the fluid, a heat exchanger, a Peltier element system, a heat extractor, and/or other components for controlling the temperature of the fluid. Particularly, the temperature controller unit 18 is configured to condition the temperature of the fluid such, that the temperature of fluid being supplied to the supply duct system 11 has a predetermined temperature T0. The predetermined temperature T0 can be, for example, a temperature lower than 30° C., for example a temperature in the range of about 15-25° C., for example about 20° C. (for example 22° C.).

The temperature controller unit 18 can keep the temperature of the fluid, discharged thereby, substantially constant during operation. Desirably, the temperature of the fluid, being fed into the supply system 11, is actively controlled, to remain at a predetermined constant temperature (for example 22.00° C.+/−0.005° C.).

The system can includes a flow controller 19 configured to control the flow rate of the conditioning fluid. Particularly, the flow controller 19 is configured to control a flow rate of conditioning fluid flowing to (and from) each of the thermal conditioning fluid reservoirs 7.

The flow controller 19 can be configured in various ways. For example, the flow controller 19 can be provided with one or more optional flow sensors, configured to detect instantaneous flow rates in one or more parts of the system. In the present embodiment (see FIGS. 1 and 2A), the flow controller 19 can include one or more controllable fluid pumps, configured to circulate the fluid (between the supply duct 11, reservoir 7, return duct 12 and fluid conditioner 18), and to achieve a desired flow rate. Arrows F depict circulation of fluid, in FIG. 2A.

In an embodiment, the flow controller 19 can be provided with one or more controllable valves to regulate fluid flow to and/or through the duct systems 11, 12. In that case, the flow controller 19 can adjust operating states of the one or more valves, to set the above-mentioned first and second flow rates.

Also, the flow controller 19 can be provided with a combination of one or more pumps and one or more valves, the pumps and/or valves being controllable.

As follows from the above, a radiation source SO can be provided, configured to generate radiation that at least partly irradiates the optical element during an irradiation step (for example to transfer a pattern from a patterning device MA onto a substrate W). A source controller LC can be provided, configured to control operation of the radiation source SO. Then, desirably, the controller LC of the radiation source SO and a conditioning fluid flow controller 19 can be configured to cooperate to set the fluid flow rates, depending on source operation. For example, during operation, the flow controller 19 can be controlled by the source control unit LC, to adjust (for example increase, decrease) a flow rate of the thermal conditioning fluid to predetermined flow rates.

For example, in a further embodiment, the flow controller 19 can be associated with a source control unit LC, for example another control unit LC of the lithographic apparatus. For example, the flow controller and source control unit LC can be integrated with each other; alternatively, the source control unit LC can be configured to control operation of the fluid flow controller 19. The source control unit LC can be (or be part of) a general control system of the lithographic apparatus.

The flow controller 19 (for example in cooperation with the source control unit LC) may be configured to provide a first flow rate during an idle mode of the respective optical element 2 (see FIG. 2A), and to provide a second flow rate during a radiation projection mode of the optical element 2 (see FIG. 2D), wherein the second flow rate is lower than the first flow rate. As is follows from the above, desirably, the setting of the flow rate (by controller 19) depends on operation of the radiation source SO; to this aim, the flow controller 19 can be controllable by the source control unit LC, as in the present embodiment. In an embodiment, one or more radiation sensors (not depicted) can be provided to detect the radiation, wherein operation of the flow controller 19 depends on detection of radiation by those one or more sensors.

Figure 2B:
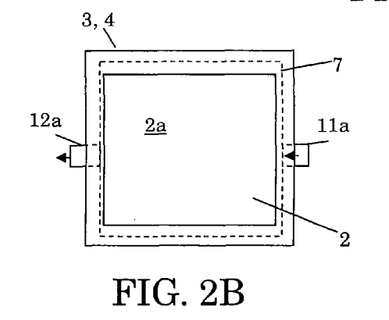
FIG. 2B depicts a bottom view of part of the apparatus shown in FIG. 2A.
Figure 2C:
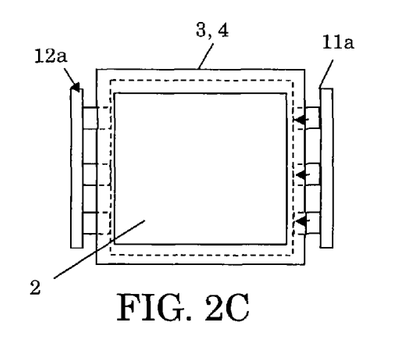
FIG. 2C is similar to FIG. 2B and schematically shows part of an embodiment of a fluid supply system.
Figure 2D:
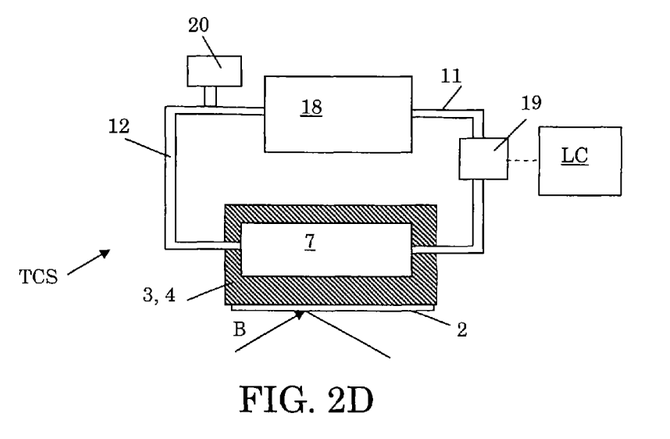
FIG. 2D depicts the part of the apparatus shown in FIG. 2A during an exposure step.

For example, the flow controller 19 can be configured to achieve: increasing the flow rate of the fluid to a first flow rate during a non-irradiation step of the optical element (see FIG. 2A); and decreasing the flow rate of the fluid to a second flow rate just before (for example one or several seconds before) an irradiation step of the optical element 2 (i.e. a step when at least part of the radiation beam B illuminates that element 2, see FIG. 2D).

Desirably, the thermal conditioning system TCS is configured to provide relatively high first flow rates in the duct systems 11, 12 and reservoir 7, such that a content of each reservoir 7 can be refreshed swiftly. For example, the thermal conditioning system can be configured to provide a first flow rate to allow a substantially full replenishment of each reservoir 7 within 60 seconds, particularly within 10 seconds and more particularly within 1 second, during operation. According to an embodiment, the system TSC can achieve a first fluid flow rate of at least 1 liter/minute, particularly at least 5 liters/minute (for example 6 liters/minute) during operation.

A second fluid flow rate, set by the flow controller 19, can be such that no replenishment of each reservoir 7 can be achieved. For example, a second flow rate can be smaller than 1 liter/minute. Particularly, the second flow rate is zero. Thus, the flow controller 19 can be configured to set the second fluid flow rate to zero during the irradiation step.

For example, the heat exchanger can be configured to allow heat exchange between a substantially stationary conditioning fluid (i.e. having a flow rate of substantially zero) and the optical element 2.

A fluid reservoir 7 as such can be configured in different ways, and some examples are shown in the drawings. Desirably, the reservoir 7 is a hollow internal space 7 in the support 4 of the optical element 2, or in the optical element, which space 7 is in fluid communication with one or more supply ports 11a and discharge ports 12a.

FIG. 2B shows an embodiment, in cross-section, wherein a single supply port 11a and a single discharge port 12a are provided. Alternatively (see FIG. 2C), a plurality of supply ports 11a can be provided, to allow a swift replenishing of the reservoir 7. Similarly, a plurality of discharge ports 12b can be provided (as in FIG. 2C). For example, a supply port 11a and discharge port 12b can be located opposite each other. More particularly, a compact configuration can include a system, wherein a fluid flow direction (of the thermal conditioning fluid) through the reservoir 7 is substantially parallel to a radiation receiving surface 2a of the optical element 2.

Desirably, substantially laminar fluid flows can be achieved in the reservoir 7 during operation, particularly when a first flow rate is being applied. For example, the reservoir 7 can include laminar flow inducers. The reservoir 7 can be configured to prevent or reduce mixing of freshly supplied fluid with fluid that is already present in the reservoir 7. In an embodiment, for example, the reservoir 7 can contain a large number of parallel channels (see FIG. 4), located between the supply and discharge sections 11a, 11b, which channels can be configured to prevent such mixing.

FIGS. 2A, 2B show an example of a reservoir 7 extending behind the respective optical element 2 (i.e. opposite a back surface of the optical element, which back surface is faced away from a front surface 2a that receives the radiation B during operation). For example, a cross-section of the reservoir 7, measured in parallel with the radiation receiving surface 2a of the element 2, can be of the same size as or larger than the size of the radiation receiving surface 2a (measured in the same direction).

Operation

Operation of the embodiment of FIGS. 1-2 can include a method for thermally conditioning an optical element, particularly one or more optical elements 2 of the projection system PS.

The method can include providing a number of irradiation steps Q (see FIG. 2D, and FIGS. 8A, 8B), including irradiating the optical element 2 with radiation B. In the present embodiment, the radiation B is (part of) a radiation beam B which is used to transfer a pattern onto substrates W.

The method also includes: providing a number of steps wherein the optical element 2 is not irradiated with the radiation (see FIG. 2A), and providing a fluid flow of the conditioning fluid, to supply thermally conditioned fluid to the reservoir (see FIG. 2A). During each of these non-irradiation steps NI, for example, the thermal conditioning system can feed the reservoir 7 of the heat exchanger 3 with an amount of thermally conditioned fluid having a predetermined temperature T0, the amount being sufficient to maintain a temperature of the optical element 2 within a predetermined operating range. Also, for example, the step can include: supplying thermally conditioned fluid having a predetermined temperature T0 to the reservoir, to thermally condition the content of the reservoir 7 to a temperature that is below a (desired) minimum threshold temperature of the optical element 2.

Heat flow is allowed between the optical element and a conditioning fluid that is held in a conditioning fluid reservoir, during both the irradiation steps and non-irradiation steps NI (see both FIG. 2A and FIG. 2D, and the graphs of FIG. 8). The heat flow can include heat flow by conduction, via the optical element 2 and parts of the support 4 that extend between the optical element 2 and the reservoir 7. In case the reservoir 7 is part of the optical element 2, naturally, heat flow to the fluid by conduction can be mainly through the optical element 2 itself. Heat flow can include heat flow within fluid held in the reservoir 7.

The flow controller 19 may control the flow rate of the fluid such that the flow rate (through the reservoir 7) is lower, for example substantially zero, during the irradiation step than the fluid flow rate (through the reservoir 7) during the non-irradiation step NI. Thus, Desirably, the fluid in the reservoir 7 is substantially stationary (with respect to the radiation receiving surface 2a of the optical element 2) during each irradiation step. For example (as follows from the above), during operation, the flow controller 19 can cooperate with a source control system LC, for example to stop fluid flow (to achieve the second flow rate) just before the source SO is being activated, and to initiate flow (to achieve the first flow rate) when or after the source SO is/has been deactivated.

Figure 8A:
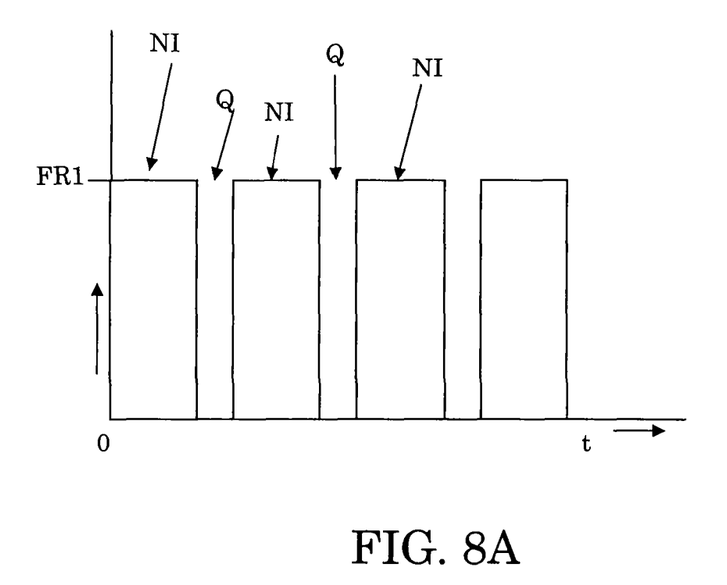
FIG. 8A depicts a graph of an example of fluid flow rate versus time, including subsequent exposure sequences and thermal conditioning sequences.
Figure 8B:
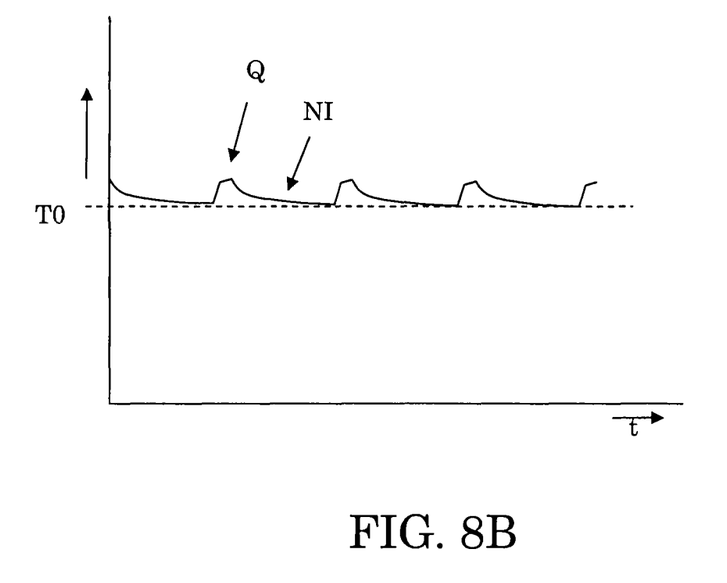
FIG. 8B depicts a graph of a fluid temperature in the fluid reservoir, relating to a first sequence example.

FIG. 8A depicts an example of a time sequence of subsequent irradiation steps Q, and fluid replenishing steps utilizing flow rates R1. An example of a resulting temperature of fluid in the reservoir 7 is shown in the graph of FIG. 8B. The initial temperature of the fluid, as provided by the fluid temperature conditioner 18, is indicated by dashed line T0. As follows from the drawings, the temperature in the reservoir will rise during irradiation of the optical element 2, when the fluid is substantially, stationary, but can return swiftly to the initial temperature T0 during each replenishing step. Also, desirably, fluid flow through the reservoir 7 is desirably maintained continuously during each non-irradiation step NI, to provide respective thermal conditioning of the optical element 2.

In this way, a precise and homogeneous thermal conditioning of the optical element 2 using a conditioning fluid, for example water, may be achieved, wherein the element 2 can be maintained at or near a desired operating temperature (for example within a relatively narrow temperature range), while receiving relatively large heat loads during irradiation steps. Surplus heat can subsequently be removed during the non-irradiation steps (i.e. reservoir replenishing steps). Operation of the optical element 2 (which can include a certain interaction with incoming radiation, for example a reflection of at least part of incoming radiation B, as in FIG. 2D) can be achieved with a high degree of precision. In particular, fluid flow induced vibrations that could impair a desired operation of the optical element 2 can be eliminated, by application of a stationary thermal conditioning fluid (instead of flowing fluid) during irradiating steps.

The fluid in the fluid reservoir 7 can act as a large and efficient heat buffer, providing a relatively large heat capacity to 'absorb' heat (i.e. drain heat from the optical element 2), particularly during activation of the source SO leading to irradiation of the optical element 2. This holds for each irradiation step (when the fluid in the reservoir 7 is desirably substantially stationary) as well as each step of replenishing the fluid (for example before and/or after an irradiation step).

When the source SO has been deactivated, for example during a substrate swap of a substrate W, or during another intermediate time period (between subsequent lithographic illumination steps), reservoir fluid that has been warmed up due to receiving the heat can be substantially replaced with fresh, cooler fluid (having for example the above-mentioned temperature, provided by a temperature control unit 18) that is supplied via the supply duct system 11. For example, in the present embodiment, the warmed up reservoir fluid can be fed to the temperature control unit 18 via the discharge system 12, to be cooled back to the desired thermal conditioning temperature.

Good results can be achieved in case a difference between the flow rate of the fluid during the irradiation step and the flow rate of the fluid during the non-irradiation step, is at least 100 ml/s.

The conditioning fluid in the reservoir 7 can be substantially replenished with fresh thermally conditioned conditioning fluid just before each irradiation step, or immediately after each irradiation step, or both before and after each irradiation step. Also, as follows from the above, conditioning fluid in the reservoir 7 is desirably not replenished during each irradiation step.

During operation, the optional pressure maintenance device 20 can communicate with the duct system 11, 12 (for example via the return duct system 12, as in the drawing) to keep the fluid pressure at or near a predetermined pressure level, for example in a predetermined fluid pressure range. For example, the pressure maintenance device 20 can counteract pressure variations of the fluid, relating to varying fluid temperatures.

Several further examples of the conditioning system are depicted in FIGS. 3-7. These examples can be combined with, or be part of, the embodiments shown in FIGS. 1 and/or 2A-2D, and can be applied in above-described methods.

Figure 3:
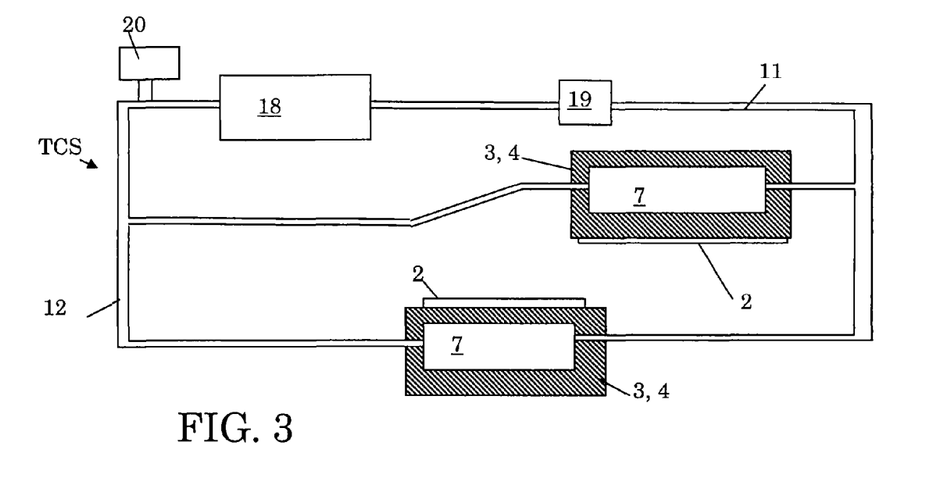
FIG. 3 schematically depicts a second example of part of the apparatus of FIG. 1.

FIG. 3 shows a further embodiment, which differs from the embodiment in FIGS. 2A-2D in that a plurality of optical elements 2 and a plurality of respective heat exchangers 3 is provided. The heat exchangers 3 are desirably arranged in parallel with respect to a respective fluid supply duct system 11, 12. Each heat exchanger 3 includes a respective fluid reservoir 7. In this way, fluid in all fluid reservoirs 7 can be replenished swiftly during a fluid replenishing step. Alternatively, or additionally, a plurality of heat exchangers 3 can be arranged in a serial configuration with respect to a respective fluid supply duct system 11, 12.

Figure 4A:
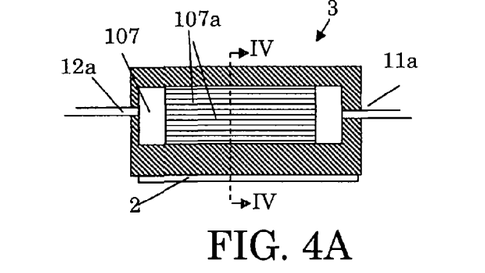
FIG. 4A shows an embodiment of the heat exchanger.
Figure 4B:
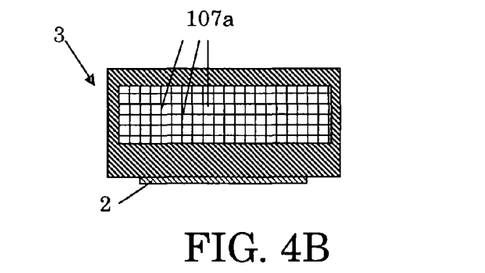
FIG. 4B is a cross-section over line IV-IV of FIG. 4A.

FIGS. 4A, 4B shows an embodiment of part of the system, which differs from the embodiments of FIGS. 1-3 in that the reservoir 107 of the heat exchanger 3 is provided with a plurality of fluid channels 107a. Desirably, the channels 107a are arranged in parallel with respect to the fluid inlet port 11a and outlet port 12a of the system. For example, each of the channels 107 can have various cross-sections, for example square (as in FIG. 4B), rectangular, circular, hexagonal, and/or different cross-sections.

Figure 5:
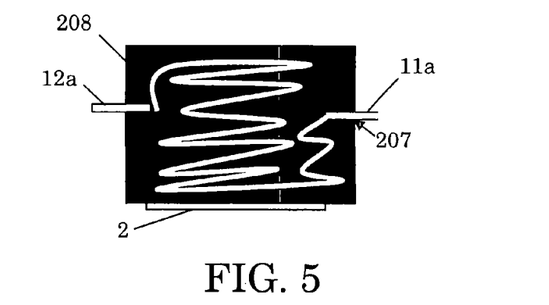
FIG. 5 shows an embodiment of the heat exchanger.

FIG. 5 differs from the embodiments of FIGS. 1-4 in that the heat exchanger 3 includes a single, elongated fluid duct 207 extending between the inlet 11a and outlet 11b. The duct 207 is embedded in a duct embedding material having a high heat capacity, for example higher than 1 kJ/kgK (at 20° C.). For example, the duct embedding material can be a solid. During operation, the thermal conditioning system TCS can feed fluid having a relatively low temperature through the duct 207, to cool the duct embedding material 208. For example, the temperature of the fluid, being fed via the inlet port 11a to the duct 207, can be lower than a desired operating temperature of a respective optical element 2 to be thermally conditioned. In this case, the duct embedding material 208 can act as a thermal buffer, absorbing heat loads from the optical element 2 during operation, wherein excess heat can be transferred to the low temperature fluid that is received in the duct 207. Again, the fluid can be kept stationary during irradiation of the optical element 2, and can be replenished (with fresh cool fluid) before and after the irradiation step. For example, the fluid can be water having a temperature in the range of 0-20° C., for example 0-10° C.

Figure 6A:
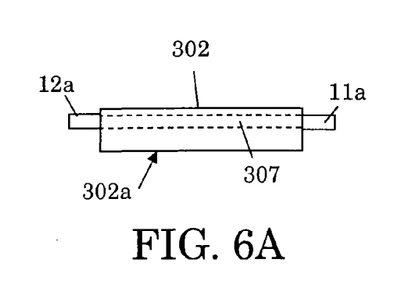
FIG. 6A shows an embodiment of the heat exchanger.
Figure 6B:
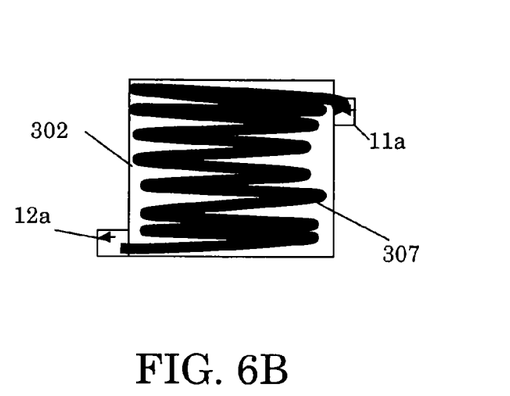
FIG. 6B schematically depicts a bottom view, similar to FIG. 2B, of an embodiment of the heat exchanger.

FIG. 6A depicts an embodiment of an optical element 302 (in this example having a reflective surface 302a to reflect radiation). The element 302 as such contains an aforementioned fluid reservoir 307. For example, the element 302 can be a self-supporting element 302. In a lithographic apparatus, the element 302 can be connected to a frame of holding member (for example a part of a projection optics box) using suitable attachment methods. The integral fluid reservoir 307 of the optical element 302 can be configured in various ways. Desirably (as follows from the above) the fluid reservoir 307 can be configured to hold a mass of conditioning fluid of at least 0.1 kg. Desirably, a substantial part of a total volume of the optical element 302 can be encompassed by the reservoir 307. According to an embodiment, at least 50%, and more particularly at least 80%, a total volume of the optical element 302 is encompassed by the reservoir 307. FIG. 6B shows an example, wherein the integral reservoir 307 is an elongated fluid duct 307. The reservoir 307 can have various other configurations, for example configurations that are the same as or similar to reservoir examples depicted in the embodiments of FIGS. 2A-2D and/or 4, or another configuration.

Figure 7:
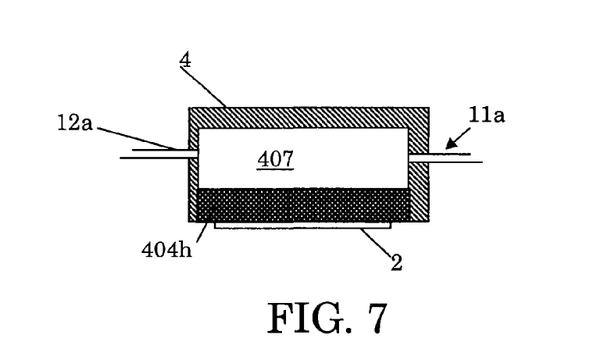
FIG. 7 shows an embodiment of the heat exchanger.

FIG. 7 shows another non-limiting example, which differs from the embodiment shown in FIG. 2A in that the heat exchanger includes a heat transfer part 404h having a high heat transfer coefficient, extending between the optical element 2 and the reservoir 407. The heat transfer part 404h can include, for example, one or more heat pipes (known as such to the skilled person), configured to allow a very low heat resistance between the optical element 2 and fluid contained in the reservoir 407. Alternatively, the heat transfer part 404h as such can be made of a material or compound having a higher heat transfer coefficient than another part 4 of the heat exchanger 3 (for example a main body 4 of the heat exchanger 3, which main body holds or comprises the transfer part 404h).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be understood that in the present application, the terms "comprising" and "including" do not exclude other elements or steps. Also, each of the terms "a" and "an" does not exclude a plurality. Any reference sign(s) in the claims shall not be construed as limiting the scope of the claims.

For example, a method according to the invention can include; applying a flow rate of the fluid during each irradiation step being is lower than a flow rate of the fluid during each non-irradiation step.

Alternatively, for example, a fluid flow rate during one or more non-irradiation steps can be the same as the flow rate during an irradiation step.

Irradiating the optical element with the radiation can be achieved in various ways, and can for example depend on the operation and/or type of radiation source that generates the respective radiation.

For example, each irradiation step can include only a single illumination time period to irradiate the optical element with the radiation (for example, in the case that the source SO is operated to provide a continuous, non-interrupted radiation beam B).

Alternatively, a (for example each) irradiation step as such can include a sequence of subsequent irradiation time periods to irradiate the optical element, and intermediate time periods when the optical element is not being irradiated (for example, in the case that the source SO is operated to provide a pulsed radiation beam B).

What is claimed is:

1. A method for thermally conditioning an optical element supported by a support, the method comprising:
    irradiating the optical element with radiation;
    not-irradiating the optical element with the radiation;
    allowing heat flow between the optical element and a conditioning fluid that is held in a conditioning fluid reservoir in the support; and
    providing a fluid flow of the conditioning fluid, to supply thermally conditioned fluid to the reservoir,
    wherein a flow rate of the fluid during the irradiating of the optical element is lower than a flow rate of the fluid when the optical element is not-irradiated,
    wherein the fluid flow rate is substantially zero during the irradiating, and
    wherein pressure variations of the conditioning fluid are counteracted in order to keep a fluid pressure of the conditioning fluid in the reservoir at or near a predetermined fluid pressure range.

2. The method according to claim 1, wherein a difference between the flow rate of the fluid during the irradiating and the flow rate of the fluid when the optical element is not irradiated is at least 100 ml/s.

3. The method according to claim 1, wherein the conditioning fluid in the reservoir is substantially replenished with fresh thermally conditioned conditioning fluid just before the irradiating, or immediately after the irradiating, or both before and after the irradiating.

4. The method according to claim 1, wherein the conditioning fluid in the reservoir is not replenished during the irradiating.

5. The method according to claim 1, further comprising supplying thermally conditioned fluid having a predetermined temperature to the reservoir, to thermally condition the content of the reservoir to a temperature that is below a minimum threshold temperature of the optical element.

6. The method according to claim 1, wherein the optical element is part of a lithographic apparatus, wherein the radiation is a radiation beam which is used to transfer a pattern onto a substrate.

7. A lithographic projection method, comprising
    transferring a pattern from a patterning structure onto a substrate, utilizing an optical element supported by a support; and
    thermally conditioning the optical element, the conditioning comprising
        irradiating the optical element with radiation;
        not-irradiating the optical element with the radiation;
        allowing heat flow between the optical element and a conditioning fluid that is held in a conditioning fluid reservoir in the support; and
        providing a fluid flow of the conditioning fluid, to supply thermally conditioned fluid to the reservoir,
        wherein a flow rate of the fluid during the irradiating of the optical element is lower than a flow rate of the fluid when the optical element is not-irradiated, and
    wherein pressure variations of the conditioning fluid are counteracted in order to keep a fluid pressure of the conditioning fluid in the reservoir at or near a predetermined fluid pressure range.

8. A thermal conditioning system constructed and arranged to thermally condition an optical element supported by a support, the system comprising:
    a heat exchanger configured to allow heat exchange between a conditioning fluid held in a thermal conditioning fluid reservoir in the support and the optical element, and
    a fluid flow controller configured to control a flow rate of the conditioning fluid to the thermal conditioning fluid reservoir, the flow controller being configured to increase the flow rate of the fluid to a first flow rate during non-irradiation of the optical element, and decrease the flow rate of the fluid to a second flow rate before irradiation of the optical element, wherein pressure variations of the conditioning fluid are counteracted in order to keep a fluid pressure of the conditioning fluid in the reservoir at or near a predetermined fluid pressure range.

9. The system according to claim 8, further comprising
    a radiation source configured to generate radiation that at least partly irradiates the optical element during the irradiation; and
    a controller configured to control operation of the radiation source, wherein the controller of the radiation source and the fluid flow controller are configured to set the fluid flow rates based on operation of the radiation source, wherein the flow controller is configured to set the second fluid flow rate to zero during the irradiation.

10. The system according to claim 8, wherein the heat exchanger includes a thermal buffer, the thermal buffer including the conditioning fluid being held in a thermal conditioning fluid reservoir.

11. A lithographic apparatus, configured to transfer a pattern from a patterning structure onto a substrate, the apparatus comprising:
    a projection system configured to project a pattern imparted to a radiation beam onto a target portion of a substrate, the projection system comprising a plurality of optical elements; and
    a thermal conditioning system configured to thermally condition at least one of the optical elements of the projection system, the thermal conditioning system comprising
        a heat exchanger configured to allow heat exchange between a conditioning fluid and the optical element,
    a flow controller configured to control the flow rate of the conditioning fluid to a support that supports the optical element, and to provide a first flow rate during an idle mode of the optical element, and to provide a second flow rate during a radiation projection mode of the optical element, wherein the second flow rate is lower than the first flow rate,
    wherein the second flow rate is zero, and
    wherein pressure variations of the conditioning fluid are counteracted in order to keep a fluid pressure of the conditioning fluid in the reservoir at or near a predetermined fluid pressure range.

12. The apparatus according to claim 11, further comprising a plurality of heat exchangers configured to allow heat exchange between the conditioning fluid and the plurality of optical elements, wherein the heat exchangers are arranged in parallel with respect to a respective fluid supply duct system.

13. A method for thermally conditioning an optical element supported by a support, the method comprising:
  irradiating the optical element with radiation;
  flowing heat between the optical element and a conditioning fluid that is held in a conditioning fluid reservoir in the support; and
  supplying thermally conditioned fluid to the reservoir at a flow rate,
  wherein the flow rate of the fluid during the irradiating is lower than the flow rate of the fluid when the optical element is not being irradiated with radiation,
  wherein the fluid flow rate is substantially zero during the irradiating, and
  wherein pressure variations of the conditioning fluid are counteracted in order to keep a fluid pressure of the conditioning fluid in the reservoir at or near a predetermined fluid pressure range.

\* \* \* \* \*